(12) United States Patent
Kim et al.

(10) Patent No.: US 10,937,844 B2
(45) Date of Patent: Mar. 2, 2021

(54) ELECTROLUMINESCENT DISPLAY DEVICE

(71) Applicant: LG Display Co., Ltd., Seoul (KR)

(72) Inventors: Jin-Hoo Kim, Paju-si (KR); Sun-Hoe Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 163 days.

(21) Appl. No.: 16/200,292

(22) Filed: Nov. 26, 2018

(65) Prior Publication Data

US 2019/0165067 A1    May 30, 2019

(30) Foreign Application Priority Data

Nov. 30, 2017  (KR) .................. 10-2017-0163246

(51) Int. Cl.
*H01L 27/32* (2006.01)
*H01L 51/52* (2006.01)
*H01L 51/50* (2006.01)

(52) U.S. Cl.
CPC ...... *H01L 27/3246* (2013.01); *H01L 51/5012* (2013.01); *H01L 51/5246* (2013.01); *H01L 51/5259* (2013.01); *H01L 51/5281* (2013.01)

(58) Field of Classification Search
None
See application file for complete search history.

(56) References Cited

U.S. PATENT DOCUMENTS

| 8,357,929 | B2* | 1/2013 | Ryu | H01L 51/525 |
| | | | | 257/40 |
| 8,803,184 | B2* | 8/2014 | Lee | H01L 51/5246 |
| | | | | 257/99 |
| 9,083,003 | B2* | 7/2015 | Lee | H01L 27/3246 |
| 2005/0046338 | A1* | 3/2005 | Park | H01L 51/525 |
| | | | | 313/504 |
| 2008/0252835 | A1* | 10/2008 | Motomatsu | G02F 1/1337 |
| | | | | 349/129 |
| 2016/0380235 | A1* | 12/2016 | Kim | H01L 51/0074 |
| | | | | 257/40 |
| 2019/0013371 | A1* | 1/2019 | Kim | H01L 51/56 |

FOREIGN PATENT DOCUMENTS

| KR | 20190006125 | * | 7/2017 |
| KR | 20190006125 A | * | 7/2017 |

* cited by examiner

*Primary Examiner* — Nishath Yasmeen
(74) *Attorney, Agent, or Firm* — Seed IP Law Group LLP

(57) ABSTRACT

An electroluminescent display device includes a first substrate including a display area and a non-display area adjacent to the display area, the display area including a plurality of pixel regions; an emitting diode on the first substrate and in each of the plurality of pixel regions; a bank disposed at a boundary of each pixel region and including a first pore; a dam disposed in the non-display area and including a second pore; and a second substrate disposed on the dam and covering the emitting diode, wherein the first pore and the second pore have a different size or volume %.

18 Claims, 4 Drawing Sheets

ELECTROLUMINESCENT DISPLAY DEVICE

CROSS-REFERENCE TO RELATED APPLICATIONS

The present application claims the benefit of Korean Patent Application No. 10-2017-0163246 filed in the Republic of Korea on Nov. 30, 2017, which is hereby incorporated by reference.

BACKGROUND

Technical Field

The present disclosure relates to a display device, and more particularly, to an electroluminescent display device being capable of improving a uniformity of an emitting layer and preventing damages on the emitting layer.

Description of the Related Art

An electroluminescent display device among new flat panel display devices is a self-emission type such that there are advantages in a viewing angle, a contrast ratio in comparison to a liquid crystal display device. In addition, since a backlight unit is not required in the electroluminescent display device, there are advantages of having a thin profile and low power consumption.

Moreover, the electroluminescent display device can be driven by DC low voltage and has fast response time. Furthermore, the electroluminescent display device is stable against outer impacts and has advantages in an operation temperature and production cost.

In an active matrix type electroluminescent display device, a voltage, which control a current applied to a pixel, is charged in a storage capacitor such that a voltage is maintained during one frame. As a result, the electroluminescent display device has an emission state in a frame regardless of a number of gate lines.

FIG. 1 is a schematic cross-sectional view of the related art electroluminescent display device.

As shown in FIG. 1, the related art electroluminescent (EL) display device includes a substrate 10, a driving thin film transistor (TFT) Td on the substrate 10 and an emitting diode D connected to the driving TFT Td.

A semiconductor layer 20 is formed on the substrate 10 of glass or plastic. The semiconductor layer 20 may include an oxide semiconductor material or a polycrystalline silicon.

A gate insulating layer 26 is formed on an entire surface of the substrate 10. The gate insulating layer 26 may be formed of an inorganic insulating material such as silicon oxide or silicon nitride.

A gate electrode 30, which is formed of a conductive material, e.g., metal, is formed on the gate insulating layer 26 to correspond to a center of the semiconductor layer 20.

An interlayer insulating layer 36, which is formed of an insulating material, is formed on the gate electrode 30 and over the entire surface of the substrate 10. The interlayer insulating layer 36 may be formed of an inorganic insulating material, e.g., silicon oxide or silicon nitride, or an organic insulating material, e.g., benzocyclobutene or photo-acryl.

The interlayer insulating layer 36 includes first and second contact holes 37 and 38 exposing both sides of the semiconductor layer 20. The first and second contact holes 37 and 38 are positioned at both sides of the gate electrode 30 to be spaced apart from the gate electrode 30.

A source electrode 40 and a drain electrode 42, which are formed of a conductive material, e.g., metal, are formed on the interlayer insulating layer 36.

The semiconductor layer 20, the gate electrode 30, the source electrode 40 and the drain electrode 42 are included in the driving TFT Td.

Although not shown, a gate line, a data line, a switching TFT, a power line are disposed on or over the substrate 10. The gate line and the data line overlap each other to form a pixel region adjacent to the overlapping location, and the switching TFT is electrically connected to the gate line and the data line. The driving TFT Td is connected to the switching TFT. A storage capacitor is further formed in the pixel region.

A passivation layer 50, which includes a drain contact hole 52 exposing the drain electrode 42 of the driving TFT Td, is formed to cover the driving TFT Td.

A first electrode 60, which is connected to the drain electrode 42 of the driving TFT Td through the drain contact hole 52, is formed.

A bank 70 is formed on the passivation layer 50 to cover an edge of the first electrode 60. The bank 70 has an opening exposing a center of the first electrode 60.

An emitting layer 62 and a second electrode 64 are sequentially stacked on the first electrode 60.

The first electrode 60, the second electrode 64 facing the first electrode 60, and the emitting layer 62 therebetween are included in the emitting diode D.

However, in the related art, the emitting layer is formed by a thermal deposition process. However, there is a limitation in the application of the thermal deposition process for the large size EL display device.

Recently, a solution process for the emitting layer has been introduced. However, the emitting layer formed by the solution process may have a non-uniform thickness such that the emitting efficiency, the display quality and the lifespan of the EL display device may be decreased.

Namely, referring to FIG. 2, which is a schematic cross-sectional view illustrating a pile-up problem of an emitting layer of the related art electroluminescent display device, in a drying process of an emitting material ink formed by the solution process, a thickness of the emitting layer 62 is thicker in the edge of the pixel region than that in the center of the pixel region. This may be referred to as the pile-up problem or a coffee-ring problem. In other words, the emitting layer 62 has a first thickness in a center of the first electrode 60, while the emitting layer 62 has a second thickness, which is greater than the first thickness, in an edge of the first electrode 60 closer to the bank 70. The emitting efficiency and the lifespan of the EL device is decreased by the thickness deviation of the emitting layer 62.

In addition, the emitting diode may be damaged by outer moisture and/or oxygen such that the emitting efficiency and the lifespan of the EL device may be further decreased.

BRIEF SUMMARY

Accordingly, the present disclosure is directed to an electroluminescent display device that substantially obviates one or more of the problems due to limitations and disadvantages of the related art.

One object of the present disclosure is to provide an electroluminescent display device having improved lifespan and emitting efficiency.

Another object of the present disclosure is to provide an electroluminescent display device having an enhanced display quality.

Another object of the present disclosure is to provide an electroluminescent display device having a uniform thickness in a large size display device.

Additional features and advantages of the disclosure will be set forth in the description which follows, and in part will be apparent from the description, or may be learned by practice of the present disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an electroluminescent display device includes a first substrate; an emitting diode on the first substrate and in each of a plurality of pixel regions included in the display area; a bank disposed at a boundary of each pixel region and including a first pore; a dam disposed in the non-display area and including a second pore; and a second a second substrate disposed on the dam and covering the emitting diode, wherein the first pore and the second pore have a difference in a size.

In another aspect, an electroluminescent display device includes a first substrate; an emitting diode on the first substrate and in each of a plurality of pixel regions in a display area; a bank disposed at a boundary of each pixel region and including a first pore; a dam disposed in the non-display area and including a second pore; and a second substrate disposed on the dam and covering the emitting diode, wherein the first pore and the second pore have a difference in a volume %.

It is to be understood that both the foregoing general description and the following detailed description are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the invention.

DETAILED DESCRIPTION

Reference will now be made in detail to the preferred embodiments, examples of which are illustrated in the accompanying drawings.

Figure 1:
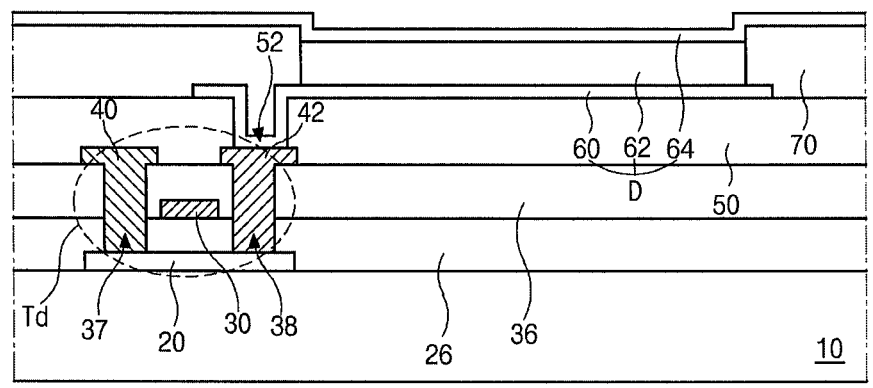
FIG. 1 is a schematic cross-sectional view of the related art electroluminescent display device.
Figure 2:
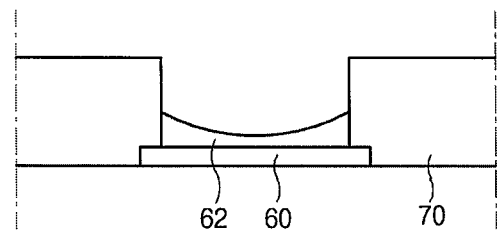
FIG. 2 is a schematic cross-sectional view illustrating a pile-up problem of an emitting layer of the related art electroluminescent display device.
Figure 3:
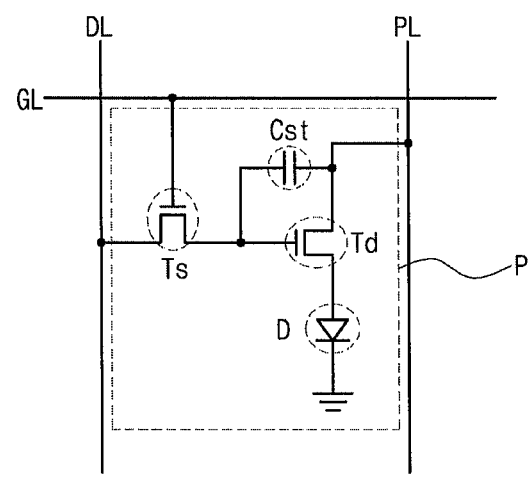
FIG. 3 is a schematic circuit diagram of an electroluminescent display device according to the present disclosure.

FIG. 3 is a schematic circuit diagram of an electroluminescent display device according to the present disclosure.

Referring to FIG. 3, an electroluminescent display device includes a gate line GL, a data line DL, a power line PL, a switching thin film transistor (TFT) Ts, a driving TFT Td, a storage capacitor Cst, and an emitting diode D. The gate line GL and the data line DL overlap each other to form a pixel region P adjacent to the overlapping location.

The switching TFT Ts is connected to the gate line GL and the data line DL, and the driving TFT Td and the storage capacitor Cst are connected to the switching TFT Ts and the power line PL. The emitting diode D is connected to the driving TFT Td.

When the switching TFT Ts is turned on by a gate signal applied through the gate line GL, a data signal from the data line DL is applied to the gate electrode of the driving TFT Td and an electrode of the storage capacitor Cst. When the driving TFT Td is turned on by the data signal, an electric current is supplied to the emitting diode D from the power line PL. As a result, the emitting diode D emits light. In this case, when the driving TFT Td is turned on, the level of electric current applied from the power line PL to the emitting diode D is determined such that the emitting diode D can produce a gray scale.

The storage capacitor Cst serves to maintain the voltage of the gate electrode of the driving TFT Td when the switching TFT Ts is turned off. Accordingly, even if the switching TFT Ts is turned off, the level of electric current applied from the power line PL to the emitting diode D is maintained to the next frame.

Figure 4:
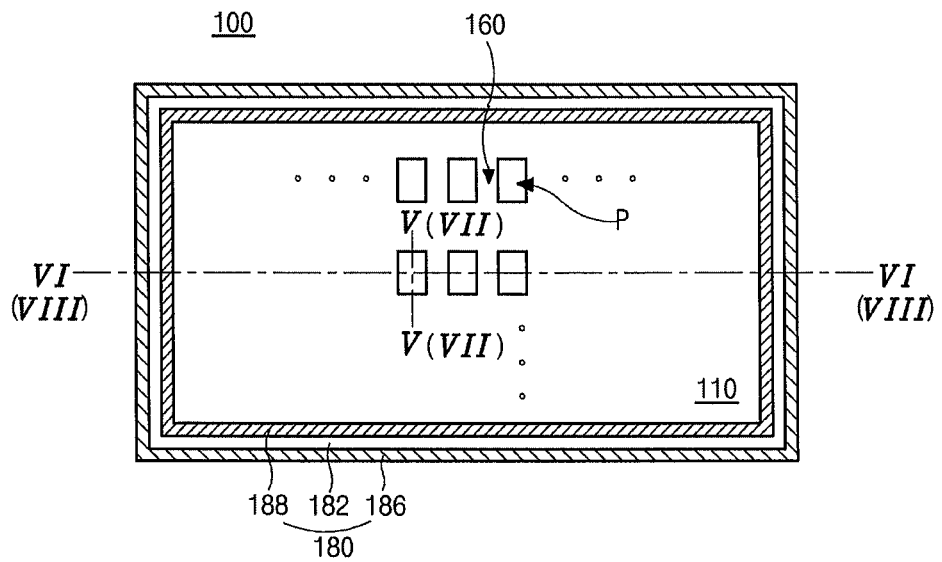
FIG. 4 is a schematic plane view of an electroluminescent display device according to the present disclosure.

FIG. 4 is a schematic plane view of an electroluminescent display device according to the present disclosure.

As shown in FIG. 4, an EL display device 100 includes a first substrate 110 where a display area and a non-display area at a periphery of the display area are formed. A plurality of pixel regions P are formed in the display area. For example, the non-display area may be disposed at four sides of the display area.

An emitting diode is disposed in each pixel region P. The emitting diode emits light by driving the EL display device 100 such that image is displayed.

A bank 160 is formed in the display area and is adjacent to each pixel region P, and a first pore (not shown) is included in the bank 160.

In addition, a dam 180 including a second pore (not shown) is formed in the non-display area. For example, the dam 180 is adjacent to the display area. In one embodiment, the dam 180 may surround the display area. The dam 180 includes a middle dam 182 including the second pore, an outer dam 186 at an outer side of the middle dam and an inner dam 188 at an inner side of the middle dam 182.

Although not shown, a second substrate contacting the dam 180 may be disposed over the first substrate 110. Namely, the second substrate may be attached to the first substrate 110. In addition, a filler (not shown) may be disposed between the second substrate and the emitting diode.

In the EL display device 100, since the bank 160 includes the first pore, the thickness of the emitting layer being non-uniformly formed is prevented. Namely, the emitting material ink may be absorbed into the first pore in the bank 160 at the edge of the pixel region P such that the pile-up problem resulting from the drying process of the emitting material ink is resolved. Accordingly, the uniformity of the emitting layer is improved.

In addition, since the dam 180 includes the second pore, the damage of the emitting diode by the foreign impurity, e.g., moisture and/or oxygen, is prevented. Namely, since the foreign impurity may be trapped by the second pore in the dam 180 or the penetrating path of the foreign impurity is increased by the second pore in the dam 180, the penetration of the foreign impurity into the emitting diode is prevented or minimized.

Accordingly, the emitting efficiency, the display quality and the lifespan of the EL display device 100 are improved.

Figure 5:
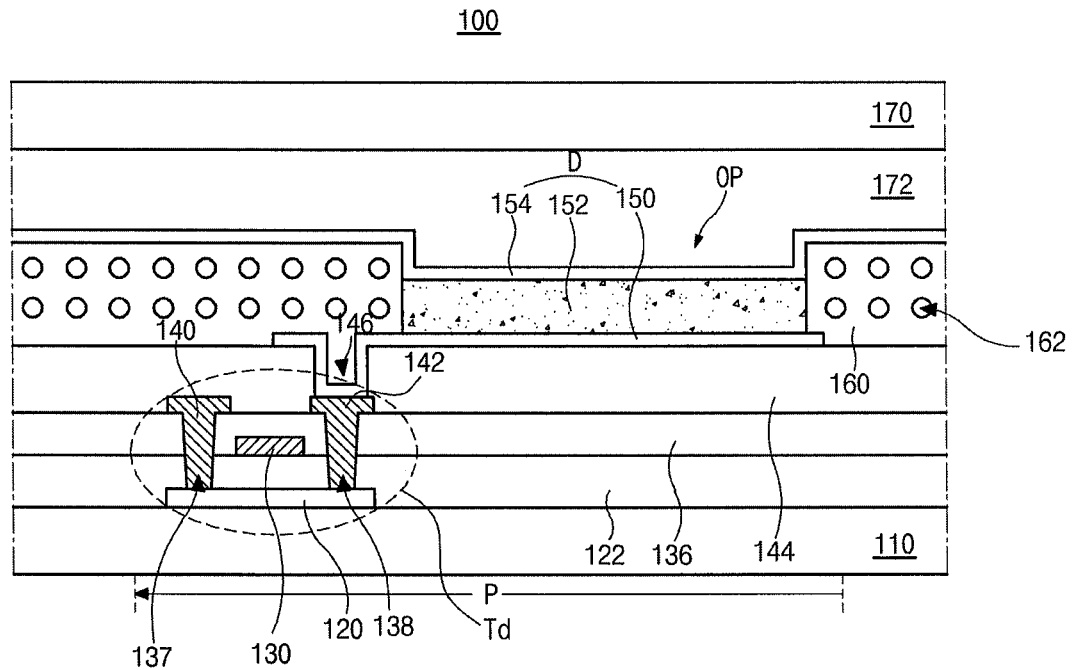
FIG. 5 is a schematic cross-sectional view of an electroluminescent display device according to a first embodiment of the present disclosure. (taken along the line V-V of FIG. 4)
Figure 6:
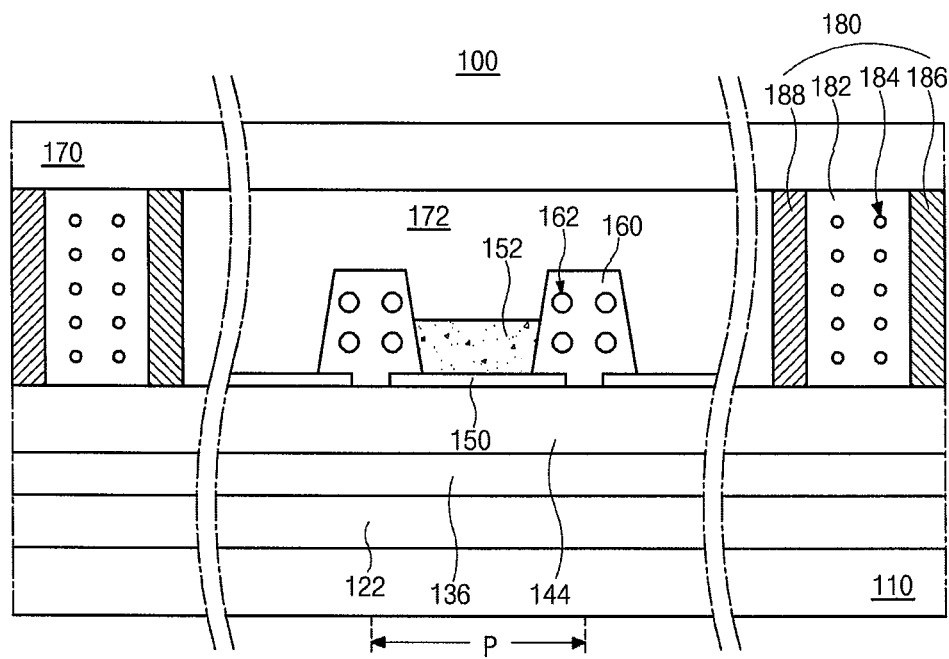
FIG. 6 is a schematic cross-sectional view of an electroluminescent display device according to a first embodiment of the present disclosure. (taken along the line VI-VI of FIG. 4)

FIG. 5 is a schematic cross-sectional view of an electroluminescent display device according to a first embodiment of the present disclosure, and FIG. 6 is a schematic cross-sectional view of an electroluminescent display device according to a first embodiment of the present disclosure. Namely, FIG. 5 is a schematic cross-sectional view taken along the line V-V of FIG. 4, and FIG. 6 is a schematic cross-sectional view taken along the line VI-VI of FIG. 4.

As shown in FIGS. 5 and 6, the EL display device 100 includes the first substrate 110, a driving TFT Td on the first substrate 110 and in each pixel region P, the emitting diode D, which is connected to the driving TFT Td and disposed in each pixel region P, the bank 160 adjacent to each pixel region P, the dam 180 disposed in the non-display area and the second substrate 170 on the dam 180. As mentioned above, the display area and the non-display area at a periphery of the display area are formed, and the plurality of pixel regions P are formed in the display area.

The gate line GL (of FIG. 3) along a first direction, the data line DL (of FIG. 3) along a second direction, the switching TFT Ts (of FIG. 3), which is connected to the gate line GL and the data line DL, and the power line PL (of FIG. 3) along one of the first and second directions are formed on the first substrate 110.

The gate line GL and the data line DL overlap each other to form the pixel region P adjacent to the overlapping location, the driving TFT Td is connected to the switching TFT Ts. In addition, the storage capacitor Cst (of FIG. 3) is further formed in the pixel region P.

Each of the first and second substrates 110 and 170 may be a glass substrate or a plastic substrate. For example, each of the first and second substrates 110 and 170 may be formed of polyimide.

A semiconductor layer 120 is formed on the first substrate 110. The semiconductor layer 120 may include an oxide semiconductor material or polycrystalline silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

A gate insulating layer 122 is formed on the semiconductor layer 120. The gate insulating layer 122 may be formed of an inorganic insulating material such as silicon oxide or silicon nitride.

A gate electrode 130, which is formed of a conductive material, e.g., metal, is formed on the gate insulating layer 122 to correspond to a center of the semiconductor layer 120. In addition, the gate line GL and a first capacitor electrode (not shown) of the storage capacitor Cst may be formed on the gate insulating layer 122. The gate line GL extends along the first direction, and the first capacitor electrode may be connected to the gate electrode 130.

In FIG. 5, the gate insulating layer 122 is formed on an entire surface of the first substrate 110. Alternatively, the gate insulating layer 122 may be patterned to have the same shape as the gate electrode 130.

An interlayer insulating layer 136, which is formed of an insulating material, is formed on the gate electrode 130. The interlayer insulating layer 136 may be formed of an inorganic insulating material, e.g., silicon oxide or silicon nitride, or an organic insulating material, e.g., benzocyclobutene or photo-acryl.

The interlayer insulating layer 136 includes first and second contact holes 137 and 138 exposing both sides of the semiconductor layer 120. The first and second contact holes 137 and 138 are positioned at both sides of the gate electrode 130 to be spaced apart from the gate electrode 130.

The first and second contact holes 137 and 138 are formed through the gate insulating layer 122. Alternatively, when the gate insulating layer 122 is patterned to have the same shape as the gate electrode 130, the first and second contact holes 137 and 138 is formed only through the interlayer insulating layer 136.

A source electrode 140 and a drain electrode 142, which are formed of a conductive material, e.g., metal, are formed on the interlayer insulating layer 136. In addition, the data line DL along the second direction, the power line PL and a second capacitor electrode (not shown) of the storage capacitor Cst may be formed on the interlayer insulating layer 136.

The source electrode 140 and the drain electrode 142 are spaced apart from each other with respect to the gate electrode 130 and respectively contact both sides of the semiconductor layer 120 through the first and second contact holes 137 and 138. The data line DL overlaps the gate line GL to form the pixel region P adjacent to the overlapping location, the power line PL, which supplying a high potential voltage, is spaced apart from the data line DL. Alternatively, the power line PL may be disposed at the same layer as the gate line and may be spaced apart from the gate line GL to be parallel to the gate line GL. The second capacitor electrode may be connected to the source electrode 140 and overlap the first capacitor electrode. As a result, the first and second capacitor electrodes and the interlayer insulating layer 136 as a dielectric layer therebetween constitute the storage capacitor Cst.

The semiconductor layer 120, the gate electrode 130, the source electrode 140 and the drain electrode 142 are included in the driving TFT Td. In the driving TFT Td, the gate electrode 130, the source electrode 140, and the drain electrode 142 are positioned over the semiconductor layer 120. Namely, the TFT Tr has a coplanar structure.

Alternatively, in the TFT Tr, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

As mentioned above, the switching TFT Ts may be further formed in the first substrate 110. The switching TFT Ts may have a structure being substantially same as the driving TFT Td.

The gate electrode 130 of the driving TFT Td may be connected to a drain electrode of the switching TFT Ts, and the source electrode 140 of the driving TFT Td may be connected to the power line PL. A gate electrode and a source electrode of the switching TFT Ts may be connected to the gate line GL and the data line DL, respectively.

A passivation layer 144, which includes a drain contact hole 146 exposing the drain electrode 142 of the driving TFT Td, is formed to cover the driving TFT Td.

A first electrode 150, which is connected to the drain electrode 142 of the driving TFT Td through the drain contact hole 146, is separately formed in each pixel region P. The first electrode 150 may be an anode and may be formed of a conductive material having a relatively high work function. For example, the first electrode 150 may be formed of a transparent conductive material such as indium-tin-oxide (ITO) or indium-zinc-oxide (IZO).

When the EL display device 100 is operated in a top-emission type, a reflection electrode or a reflection layer may be formed under the first electrode 150. For example, the reflection electrode or the reflection layer may be formed of aluminum-palladium-copper (APC) alloy. The first electrode 150 may have a triple-layered structure of ITO/Ag/ITO.

A bank 160 is formed on the passivation layer 144 to cover an edge of the first electrode 150. Namely, the bank 160 is positioned at a boundary of the pixel region P. Since the bank 160 includes an opening OP, the bank 160 is positioned adjacent to the pixel region P and exposes a center of the first electrode 160 in correspondence to the pixel region P. In addition, the bank 160 includes the first pore 162.

An emitting layer 152 is formed on the first electrode 150. The emitting layer 152 may be formed by a solution process using a liquid phase emitting material.

Namely, an emitting material ink, in which an emitting material is dissolved in a solvent, is coated and dried to form the emitting layer 152. For example, the solution process may be an inkjet coating process, a slit coating process, a spin coating process, a printing process or a drop coating process, but it is not limited thereto.

The emitting material 152 includes at least one of an organic emitting material, such as a phosphorescent compound (phosphorescent emitting material) or a fluorescent compound (fluorescent emitting material), and an inorganic emitting material, such as a quantum dot.

The emitting layer 152 may have a single-layered structure of an emitting material layer (EML) including the emitting material. To improve an emitting efficiency of the emitting diode D, the emitting layer 152 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 150 and the EML, and the ETL and the EIL may be sequentially stacked on the EML.

As described above, in the related art EL display device, when the emitting layer is formed by the solution process, the pile-up problem is generated in the drying process such that a thickness deviation in the emitting layer is generated.

However, in the EL display device 100 of the present disclosure, since the bank 160 covering the edge of the first electrode 150 includes the first pore 162, the emitting material ink in the edge of the first electrode 150 or the edge of the pixel region P is absorbed by the first pore 162 such that the pile-up problem is prevented or minimized.

To efficiently prevent or minimize the pile-up problem, the first pore 162 may have a first size of about several hundred nanometers to several ten micrometers. For example, the first size of the first pore 162 may be about 100 nm to 99 μm. When the first size of the first pore 162 is too small (e.g., less than about 100 nm), the emitting material ink is insufficiently absorbed by the first pore 162 such that there is a limitation of overcoming the pile-up problem. On the other hand, when the first size of the first pore 162 is too large (e.g., more than about 99 μm), the emitting material ink in adjacent pixel region may be mixed such that the color mixture problem may be generated.

Since the emitting material ink is absorbed into the first pore 162, the first pore 162 in the bank 160 of the EL display device 100 may be filled with the emitting material of the emitting layer 152.

For example, the first pore 162 at a surface side of the bank 160 may be filled with the emitting material of the emitting layer 162, while the first pore 162 at a center side of the bank 160 may be empty. Namely, the material of the emitting layer 152 may fill a part of the first pore 162 adjacent to the emitting layer 152.

The first pore 162 may be formed by a chemical reaction method, a selective etching method, an addition of a water-soluble salt or an expandable salt, using a supercritical fluid or a phase-separation of block co-polymer, but it is not limited thereto.

For example, the bank 160 having the first pore 162 may be formed by the hydrothermal reaction using an organic molecule, e.g., surfactant or amphiphilic polymer, as a configuration inducing material. Since the surfactant and the amphiphilic polymer includes a hydrophilic part and a hydrophobic part, the surfactant and the amphiphilic polymer may form a micelle structure or a liquid crystal structure by self-assembling ion the aqueous solution such that a super-molecule is formed. By using the super-molecule as a template, a mesoporous material can be formed. The size of the pore can be controlled according to a kind of the surfactant or the amphiphilic polymer or a condition of the process.

After acid-treating a surface of the bank 160, an electrochemical method may be used to form the first pore 162 in the bank 160.

In addition, by adding an aqueous expandable salt, e.g., sodium chloride (NaCl), sodium bicarbonate ($NaHCO_3$) or ammonium bicarbonate ($NH_4HCO_3$), into a polymer solution, the bank 160 including the first pore 162 may be formed.

The bank 160 may be formed of an insulating material such as polyimide, but it is not limited thereto.

A second electrode 154 is formed over the first substrate 110 including the emitting layer 152. The second electrode 154 covers an entire surface of the display area and may be formed of a conductive material having a relatively low work function to serve as a cathode. For example, the second electrode 154 may be formed of aluminum (Al), magnesium (Mg) or Al—Mg alloy.

For the sake of the explanation, the second electrode is not shown in FIG. 6.

In the top-emission type EL display device 100, the second electrode 154 may have a relatively small thickness to transmit light. On the other hand, in the bottom-emission type EL display device 100, the second electrode 154 may be a reflective electrode.

The first electrode 150, the second electrode 154 facing the first electrode 150, and the emitting layer 152 therebetween are included in the emitting diode D.

The dam 180 including the second pore 184 is formed in the non-display area of the first substrate 110. In one embodiment, the dam 180 including the second pore 184 is adjacent to the display area. For example, the dam 180 including the second pore 184 surrounds the display area in which the plurality of pixel regions P are formed.

The dam 180 includes the middle dam 182, the outer dam 186 at an outer side of the middle dam 182 and the inner dam 188 at an inner side of the middle dam 182. In this instance, the second pore 184 may be included in the middle dam 182 except the outer and inner dams 186 and 188.

The emitting diode D in the pixel region P is damaged by outer moisture and/or oxygen such that the display quality and/or the lifespan of the EL display device may be decreased.

To prevent the penetration of outer moisture and/or oxygen, a dam may be formed in the non-display area. However, when a defect, e.g., a crack, is generated in the dam, outer moisture and/or oxygen is penetrated into the display area while the emitting diode is formed.

However, in the EL display device 100 of the present disclosure, since the dam 180 including the second pore 184 is formed in the non-display area adjacent to the display area, foreign impurity, such as outer moisture and/or oxygen, is trapped by the second pore 184 in the dam 180 such that the penetration of the foreign impurity is prevented or minimized.

The second pore 184 in the dam 180 has a second size being smaller than the first size of the first pore 162 in the bank 160. The second size of the second pore 184 may be several nanometers to several tens nanometers. For example, the second size of the second pore 184 may be about 1 nm to 99 nm.

When the second size of the second pore 184 is too small (e.g., less than about 1 nm), there is a limitation in trapping the foreign impurity. On the other hand, when the second size of the second pore 184 is too large (e.g., more than about 99 nm), the second pores 184 may be connected to each other such that a penetration path of the foreign impurity may be generated.

The second pore 184 may be formed by a chemical reaction method, a selective etching method, an addition of a water-soluble salt or an expandable salt, using a supercritical fluid or a phase-separation of block co-polymer, but it is not limited thereto.

The middle dam 182 may be formed of polyimide. Namely, the bank 160 and the middle dam 182 may be formed of the same material. Alternatively, the bank 160 and the middle dam 182 may be formed of different materials. For example, to increase the moisture blocking property, the middle dam 182 may be formed of silicon-based resin. However, the material of the middle dam 182 is not limited thereto.

Each of the outer dam 186 and the inner dam 188 may be formed of epoxy-based material or acryl-based material. The outer dam 186 and the inner dam 188 may be formed of the same material or different materials.

For example, after the first electrode 150 is formed, the dam 160 and the middle dam 182 may be formed. After the emitting layer 152 and the second electrode 154 are formed, the outer and inner dams 186 and 188 may be formed.

The second substrate 170 and the first electrode 150, where the emitting diode D and the dam 182 are formed, are attached with the filler 172 therebetween. The second substrate 170 may contact the filler 172 and the dam 180. Namely, the second substrate 170 is disposed on the dam 182 and covers the emitting diode D.

The filler 172 may be formed of epoxy-based resin. In the top-emission type EL display device 100, the filler 172 may be transparent. Alternatively, in the bottom-emission type EL display device 100, the filler 172 may be opaque.

As mentioned above, the EL display device 100 of the present disclosure includes the bank 160 including the first pore 162 that is adjacent to each pixel region P and the dam 180 including the second pore 184 that is adjacent to the display area. The thickness non-uniformity problem in the emitting layer 152 resulting from the solution process is prevented or minimized by the first pore 162, and the penetration of the foreign impurity is prevented or minimized by the second pore 184.

In addition, since the first pore 162 and the second pore 184 have a difference in a size, the thickness non-uniformity problem and the penetration of the foreign impurity are further prevented or minimized.

Figure 7:
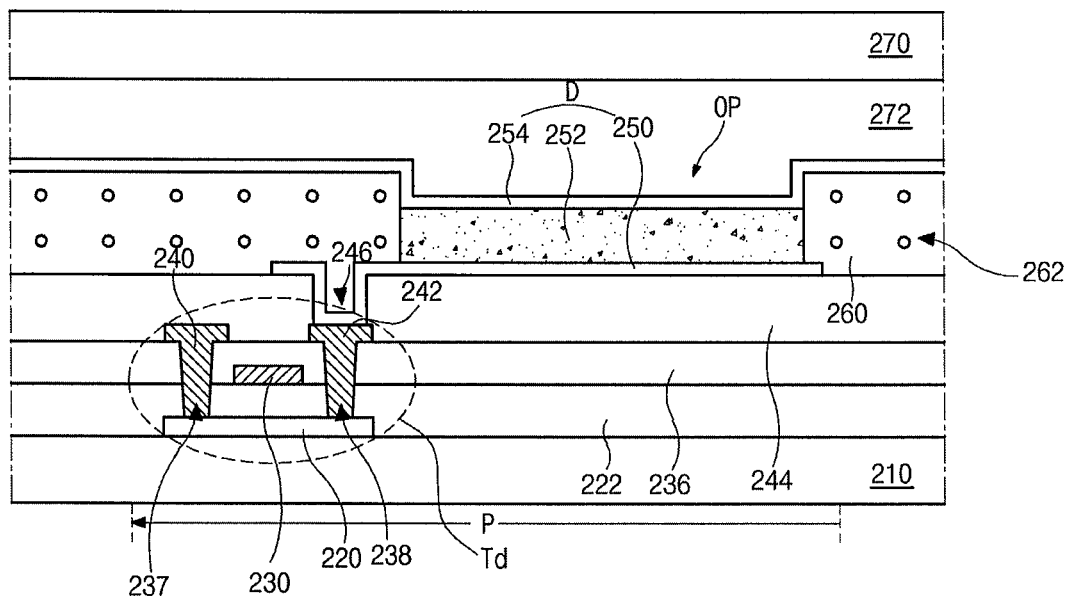
FIG. 7 is a schematic cross-sectional view of an electroluminescent display device according to a second embodiment of the present disclosure. (taken along the line VII-VII of FIG. 4)
Figure 8:
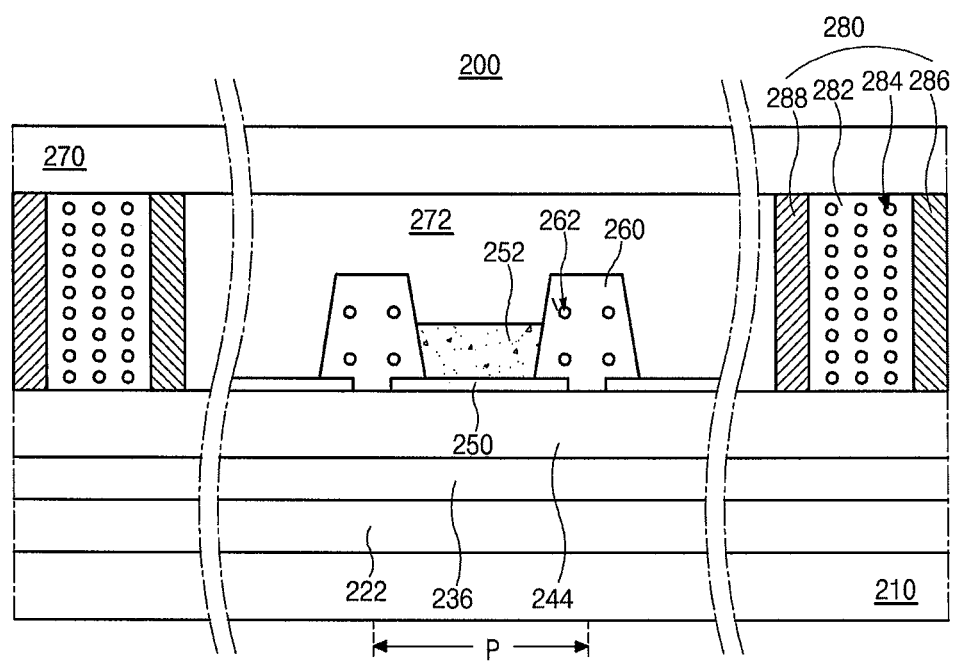
FIG. 8 is a schematic cross-sectional view of an electroluminescent display device according to a first embodiment of the present disclosure. (taken along the line VIII-VIII of FIG. 4)

FIG. 7 is a schematic cross-sectional view of an electroluminescent display device according to a second embodiment of the present disclosure, and FIG. 8 is a schematic cross-sectional view of an electroluminescent display device according to a second embodiment of the present disclosure. Namely, FIG. 7 is a schematic cross-sectional view taken along the line VII-VII of FIG. 4, and FIG. 8 is a schematic cross-sectional view taken along the line VIII-VIII of FIG. 4.

As shown in FIGS. 7 and 8, the EL display device 200 includes the first substrate 210, a driving TFT Td on the first substrate 210 and in each pixel region P, the emitting diode D, which is connected to the driving TFT Td and disposed in each pixel region P, the bank 260 adjacent to each pixel region P, the dam 280 disposed in the non-display area and the second substrate 270 on the dam 280. As mentioned above, the display area and the non-display area at a periphery of the display area are formed, and the plurality of pixel regions P are formed in the display area.

The gate line GL (of FIG. 3) along a first direction, the data line DL (of FIG. 3) along a second direction, the switching TFT Ts (of FIG. 3), which is connected to the gate line GL and the data line DL, and the power line PL (of FIG. 3) along one of the first and second directions are formed on the first substrate 210.

The gate line GL and the data line DL overlap each other to form the pixel region P adjacent to the overlapping location, the driving TFT Td is connected to the switching TFT Ts. In addition, the storage capacitor Cst (of FIG. 3) is further formed in the pixel region P.

Each of the first and second substrates 210 and 270 may be a glass substrate or a plastic substrate. For example, each of the first and second substrates 210 and 270 may be formed of polyimide.

A semiconductor layer 220 is formed on the first substrate 210. The semiconductor layer 220 may include an oxide semiconductor material or polycrystalline silicon.

A gate insulating layer 222 is formed on the semiconductor layer 220. The gate insulating layer 222 may be formed of an inorganic insulating material such as silicon oxide or silicon nitride.

A gate electrode 230, which is formed of a conductive material, e.g., metal, is formed on the gate insulating layer 222 to correspond to a center of the semiconductor layer 220. In addition, the gate line GL and a first capacitor electrode (not shown) of the storage capacitor Cst may be formed on the gate insulating layer 222. The gate line GL extends along the first direction, and the first capacitor electrode may be connected to the gate electrode 230.

An interlayer insulating layer 236, which is formed of an insulating material, is formed on the gate electrode 230. The interlayer insulating layer 236 may be formed of an inorganic insulating material, e.g., silicon oxide or silicon nitride, or an organic insulating material, e.g., benzocyclobutene or photo-acryl.

The interlayer insulating layer 236 includes first and second contact holes 237 and 238 exposing both sides of the semiconductor layer 220. The first and second contact holes 237 and 238 are positioned at both sides of the gate electrode 230 to be spaced apart from the gate electrode 230.

A source electrode 240 and a drain electrode 242, which are formed of a conductive material, e.g., metal, are formed on the interlayer insulating layer 236. In addition, the data line DL along the second direction, the power line PL and a second capacitor electrode (not shown) of the storage capacitor Cst may be formed on the interlayer insulating layer 236.

The source electrode 240 and the drain electrode 242 are spaced apart from each other with respect to the gate electrode 230 and respectively contact both sides of the semiconductor layer 220 through the first and second contact holes 237 and 238. The data line DL overlaps the gate line GL to form the pixel region P adjacent to the overlapping location, the power line PL, which supplying a high potential voltage, is spaced apart from the data line DL. Alternatively, the power line PL may be disposed at the same layer as the gate line and may be spaced apart from the gate line GL to be parallel to the gate line GL. The second capacitor electrode may be connected to the source electrode 240 and overlap the first capacitor electrode. As a result, the first and second capacitor electrodes and the interlayer insulating layer 236 as a dielectric layer therebetween constitute the storage capacitor Cst.

The semiconductor layer 220, the gate electrode 230, the source electrode 240 and the drain electrode 242 constitute the driving TFT Td.

As mentioned above, the switching TFT Ts may be further formed in the first substrate 210. The switching TFT Ts may have a structure being substantially same as the driving TFT Td.

The gate electrode 230 of the driving TFT Td may be connected to a drain electrode of the switching TFT Ts, and the source electrode 240 of the driving TFT Td may be connected to the power line PL. A gate electrode and a source electrode of the switching TFT Ts may be connected to the gate line GL and the data line DL, respectively.

A passivation layer 244, which includes a drain contact hole 246 exposing the drain electrode 242 of the driving TFT Td, is formed to cover the driving TFT Td.

A first electrode 250, which is connected to the drain electrode 242 of the driving TFT Td through the drain contact hole 246, is separately formed in each pixel region P. The first electrode 250 may be an anode and may be formed of a conductive material having a relatively high work function. For example, the first electrode 250 may be formed of a transparent conductive material such as indium-tin-oxide (ITO) or indium-zinc-oxide (IZO).

A reflection electrode or a reflection layer may be formed under the first electrode 250. For example, the reflection electrode or the reflection layer may be formed of aluminum-palladium-copper (APC) alloy. The first electrode 250 may have a triple-layered structure of ITO/Ag/ITO.

A bank 260 is formed on the passivation layer 244 to cover an edge of the first electrode 250. Namely, the bank 260 is positioned at a boundary of the pixel region P. Since the bank 260 includes an opening OP, the bank 260 is positioned adjacent to the pixel region P and exposes a center of the first electrode 260 in correspondence to the pixel region P. In addition, the bank 260 includes the first pore 262.

An emitting layer 252 is formed on the first electrode 250. The emitting layer 252 may be formed by a solution process using a liquid phase emitting material.

Namely, an emitting material ink, in which an emitting material is dissolved in a solvent, is coated and dried to form the emitting layer 252. For example, the solution process may be an inkjet coating process, a slit coating process, a spin coating process, a printing process or a drop coating process, but it is not limited thereto.

The emitting material 252 includes at least one of an organic emitting material, such as a phosphorescent compound or a fluorescent compound, and an inorganic emitting material, such as a quantum dot.

The emitting layer 252 may have a single-layered structure of an emitting material layer (EML) including the emitting material. To improve an emitting efficiency of the emitting diode D, the emitting layer 252 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 150 and the EML, and the ETL and the EIL may be sequentially stacked on the EML.

As described above, in the related art EL display device, when the emitting layer is formed by the solution process, the pile-up problem is generated in the drying process such that a thickness deviation in the emitting layer is generated.

However, in the EL display device 200 of the present disclosure, since the bank 260 covering the edge of the first electrode 250 includes the first pore 262, the emitting material ink in the edge of the first electrode 250 or the edge of the pixel region P is absorbed by the first pore 262 such that the pile-up problem is prevented or minimized.

To efficiently prevent or minimize the pile-up problem, the first pore 262 may have a first volume % (volume ratio) with respect to a total volume of the bank 260. For example, the first volume % may be about 5 to 20%. When the first volume % of the first pore 262 is too small (e.g., less than about 5%), the emitting material ink is insufficiently absorbed by the first pore 262 such that there is a limitation of overcoming the pile-up problem. On the other hand, when the first volume % of the first pore 2162 is too large (e.g., more than about 20%), the emitting material ink in adjacent pixel region may be mixed such that the color mixture problem may be generated.

Since the emitting material ink is absorbed into the first pore 262, the first pore 262 in the bank 260 of the EL display device 200 may be filled with the emitting material of the emitting layer 252.

For example, the first pore 262 at a surface side of the bank 260 may be filled with the emitting material of the emitting layer 262, while the first pore 262 at a center side of the bank 260 may be empty.

The first pore 262 may be formed by a chemical reaction method, a selective etching method, an addition of a water-soluble salt or an expandable salt, using a supercritical fluid or a phase-separation of block co-polymer, but it is not limited thereto.

The bank 260 may be formed of an insulating material such as polyimide, but it is not limited thereto.

A second electrode 254 is formed over the first substrate 210 including the emitting layer 252. The second electrode 254 covers an entire surface of the display area and may be formed of a conductive material having a relatively low work function to serve as a cathode. For example, the second electrode 254 may be formed of aluminum (Al), magnesium (Mg) or Al—Mg alloy.

For the sake of the explanation, the second electrode is not shown in FIG. 8.

The first electrode 250, the second electrode 254 facing the first electrode 250, and the emitting layer 252 therebetween are included in the emitting diode D.

The dam 280 including the second pore 284 is formed in the non-display area of the first substrate 210. For example, the dam 280 including the second pore 284 surrounds the display area in which the plurality of pixel regions P are formed.

The dam 280 includes the middle dam 282, the outer dam 286 at an outer side of the middle dam 282 and the inner dam 288 at an inner side of the middle dam 282. In this instance, the second pore 284 may be included in the middle dam 282 except the outer and inner dams 286 and 288.

The emitting diode D in the pixel region P is damaged by outer moisture and/or oxygen such that the display quality and/or the lifespan of the EL display device may be decreased.

To prevent the penetration of outer moisture and/or oxygen, a dam may be formed in the non-display area. However, when a defect, e.g., a crack, is generated in the dam, outer moisture and/or oxygen is penetrated into the display area while the emitting diode is formed.

However, in the EL display device 200 of the present disclosure, since the dam 280 includes the second pore 284 is formed in the non-display area adjacent to the display area, foreign impurity, such as outer moisture and/or oxygen, is trapped by the second pore 284 in the dam 280 such that the penetration of the foreign impurity is prevented or minimized.

The second pore 284 has a second volume % (volume ratio) with respect to a total volume of the middle dam 282. The second volume % may be greater than the first volume %. For example, the second volume % may be about 10 to 40%.

When the second size of the second pore 284 is too small (e.g., less than about 10%), there is a limitation in trapping the foreign impurity. On the other hand, when the second size of the second pore 284 is too large (e.g., more than about 40%), the second pores 284 may be connected to each other such that a penetration path of the foreign impurity may be generated. Although the pores 284 are connected to each other, the penetration of the foreign impurity is delayed when the second volume % of the second pore 284 is within the above range.

In the EL display device 100 according to the first embodiment of the present disclosure, the first pore 162 and the second pore 184 have a difference in a size. In the EL display device 200 according to the second embodiment of the present disclosure, the first pore 262 and the second pore 284 have substantially the same size and a difference in a density such that the first pore 262 and the second pore 284 have a difference in a volume %.

The second pore 284 may be formed by a chemical reaction method, a selective etching method, an addition of a water-soluble salt or an expandable salt, using a supercritical fluid or a phase-separation of block co-polymer, but it is not limited thereto.

The middle dam 282 may be formed of polyimide or silicon-based resin, and each of the outer dam 286 and the inner dam 288 may be formed of epoxy-based material or acryl-based material.

The second substrate 270 and the first electrode 210, where the emitting diode D and the dam 282 are formed, are attached with the filler 272 therebetween. The second substrate 270 may contact the filler 272 and the dam 280. Namely, the second substrate 270 is disposed on the dam 282 and covers the emitting diode D.

As mentioned above, the EL display device 200 of the present disclosure includes the bank 260 including the first pore 262 being adjacent to each pixel region P and the dam 280 including the second pore 284 being adjacent to the display area. The thickness of the emitting layer 252 not being uniform resulting from the solution process is prevented or minimized by the first pore 262, and the penetration of the foreign impurity is prevented or minimized by the second pore 284.

In addition, since the first pore 262 and the second pore 284 have a difference in a volume %, the non-uniform thickness problem and the penetration of the foreign impurity are further prevented or minimized.

To achieve the aforementioned advantages, as embodied and broadly described herein, an electroluminescent display device according to the present disclosure may include a first substrate including a display area and a non-display area adjacent to the display area, the display area including a plurality of pixel regions; an emitting diode on the first substrate and in each of the plurality of pixel regions; a bank disposed at a boundary of each pixel region and including a first pore; a dam disposed in the non-display area and including a second pore; and a second substrate disposed on the dam and covering the emitting diode, wherein the first pore and the second pore have a difference in a size.

In another aspect, an electroluminescent display device according to the present disclosure may include a first substrate including a display area and a non-display area adjacent to the display area, the display area including a plurality of pixel regions; an emitting diode on the first substrate and in each of the plurality of pixel regions; a bank disposed at a boundary of each pixel region and including a first pore; a dam disposed in the non-display area and including a second pore; and a second substrate disposed on the dam and covering the emitting diode, wherein the first pore and the second pore have a difference in a volume %.

It will be apparent to those skilled in the art that various modifications and variations can be made in the present disclosure without departing from the spirit or scope of the invention. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device including a display area and a non-display area adjacent to the display area, the display area including a plurality of pixel regions, comprising:
an emitting diode included in each of the plurality of pixel regions and including a first electrode, a second electrode facing the first electrode and an emitting layer between the first and second electrodes;
a bank including a plurality of first pores disposed adjacent to each pixel region and covering an edge of the first electrode;
a dam including a plurality of second pores disposed in the non-display area; and
a substrate overlain on the dam and the emitting diode,
wherein the plurality of first pores and the plurality of second pores have a different size, and
wherein a material of the emitting layer fills at least one of the plurality of first pores adjacent to the emitting layer, and the at least one of the plurality of first pores is completely filled with the material of the emitting layer.

2. The electroluminescent display device according to claim 1, wherein each of the plurality of first pores has a first size, and each of the plurality of second pores has a second size being smaller than the first size.

3. The electroluminescent display device according to claim 2, wherein the first size is several hundred nanometers to several ten micrometers, and the second size is several nanometers to several tens nanometers.

4. The electroluminescent display device according to claim 1, wherein the dam comprising:
an outer dam at an outer side of the dam; and
an inner dam at an inner side of the dam being more adjacent to the display area than the outer dam.

5. The electroluminescent display device according to claim 1, wherein the emitting layer being formed by a solution process.

6. The electroluminescent display device according to claim 1, wherein the plurality of second pores of the dam is configured to absorb foreign impurities, the foreign impurities including at least one of moisture or oxygen.

7. The electroluminescent display device according to claim 5, wherein the emitting layer includes one of a phosphorescent emitting material, a fluorescent emitting material and a quantum dot.

8. The electroluminescent display device according to claim 1, further comprising:
a thin film transistor positioned adjacent to the emitting diode, wherein the emitting diode is connected to the thin film transistor.

9. The electroluminescent display device according to claim 1, wherein the bank and the dam are formed of the same material.

10. An electroluminescent display device including a display area and a non-display area adjacent to the display area, the display area including a plurality of pixel regions, comprising:
a first substrate;
an emitting diode included in each of the plurality of pixel regions and over the first substrate, the emitting diode including a first electrode, a second electrode facing the first electrode and an emitting layer between the first and second electrodes;
a bank including a plurality of first pores positioned adjacent to each pixel region and covering an edge of the first electrode;
a dam including a plurality of second pores positioned in the non-display area; and
a second substrate disposed on the dam and overlying the emitting diode, the second substrate facing the first substrate,
wherein the first and second substrates are attached to each other by the dam, and
wherein the plurality of first pores and the plurality of second pores have a different volume %, and
wherein a material of the emitting layer fills at least one of the plurality of first pores adjacent to the emitting layer, and the at least one of the plurality of first pores is completely filled with the material of the emitting layer.

11. The electroluminescent display device according to claim 10, wherein the first pore has a first volume % with respect to the volume of the bank, and the second pore has a second volume % with respect to the volume of the dam, and wherein the second volume % is greater than the first volume %.

12. The electroluminescent display device according to claim 11, wherein the first volume % is about 5% to 20%, and the second volume % is about 10% to 40%.

13. The electroluminescent display device according to claim 10, wherein the dam further comprising:
an outer dam at an outer side of the dam; and
an inner dam at an inner side of the dam being more closely positioned to the display area than the outer dam.

14. The electroluminescent display device according to claim 10, wherein the emitting layer being formed by a solution process.

15. The electroluminescent display device according to claim 10, wherein the plurality of second pores of the dam is configured to absorb foreign impurities, the foreign impurities including at least one of moisture or oxygen.

16. The electroluminescent display device according to claim 14, wherein the emitting layer includes at least one of a phosphorescent emitting material, a fluorescent emitting material and a quantum dot.

17. The electroluminescent display device according to claim 10, further comprising:
a thin film transistor positioned adjacent to the emitting diode, wherein the emitting diode is connected to the thin film transistor.

18. The electroluminescent display device according to claim 10, wherein the bank and the dam are formed of the same material.

* * * * *